(12) United States Patent
Komaru et al.

(10) Patent No.: US 10,439,262 B2
(45) Date of Patent: Oct. 8, 2019

(54) HIGH FREQUENCY SWITCH

(71) Applicant: Mitsubishi Electric Corporation, Tokyo (JP)

(72) Inventors: Ryota Komaru, Tokyo (JP); Masatake Hangai, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/769,162

(22) PCT Filed: Dec. 9, 2015

(86) PCT No.: PCT/JP2015/084523
§ 371 (c)(1),
(2) Date: Apr. 18, 2018

(87) PCT Pub. No.: WO2017/098602
PCT Pub. Date: Jun. 15, 2017

(65) Prior Publication Data
US 2018/0301778 A1    Oct. 18, 2018

(51) Int. Cl.
*H01P 1/15*    (2006.01)
*H03K 17/693*  (2006.01)
(Continued)

(52) U.S. Cl.
CPC ............ *H01P 1/15* (2013.01); *H03H 7/465* (2013.01); *H03K 17/693* (2013.01); *H04B 1/48* (2013.01)

(58) Field of Classification Search
CPC ..... H01P 1/15; H01P 1/18; H01P 1/20; H04B 1/44
(Continued)

(56) References Cited

U.S. PATENT DOCUMENTS 5,920,241 A * 7/1999 Mazzochette ............ H03H 7/19
                                                    333/171
6,788,169 B1 * 9/2004 Schemmann ............. H03F 1/32
                                                    333/177
(Continued)

FOREIGN PATENT DOCUMENTS

JP    2010-028440 A    2/2010
JP    2012-070354 A    4/2012
(Continued)

OTHER PUBLICATIONS

International Search Report for PCT/JP2015/084523 (PCT/ISA/210) dated Mar. 1, 2016.
(Continued)

*Primary Examiner* — Dean O Takaoka
(74) *Attorney, Agent, or Firm* — Birch, Stewart, Kolasch & Birch, LLP (57) ABSTRACT

There are provided: a first capacitor connected between first and second input/output terminals; a second capacitor connected between the first input/output terminal and a third input/output terminal; a first inductor having one end connected to the first input/output terminal; a second inductor having one end connected to the second input/output terminal and another end connected to another end of the first inductor; a third inductor having one end connected to the first input/output terminal; a fourth inductor having one end connected to the third input/output terminal and another end connected to another end of the third inductor; a first transistor having a drain terminal connected to said another ends of the first and second inductors and a source terminal that is grounded; and a second transistor having a drain terminal connected to said another ends of the third and fourth inductors and a source terminal that is grounded.

10 Claims, 5 Drawing Sheets

(51) Int. Cl.
*H04B 1/48* (2006.01)
*H03H 7/46* (2006.01)
*H04B 1/44* (2006.01)

(58) Field of Classification Search
USPC .................................................. 333/101, 103
See application file for complete search history.

(56) References Cited

U.S. PATENT DOCUMENTS

| | | | | |
|---|---|---|---|---|
| 7,123,116 | B2* | 10/2006 | Hieda | H03H 11/18 |
| | | | | 333/164 |
| 7,495,529 | B2* | 2/2009 | Miyaguchi | H01P 1/15 |
| | | | | 333/101 |
| 7,541,894 | B2* | 6/2009 | Miyaguchi | H01P 1/185 |
| | | | | 333/139 |
| 8,212,632 | B2* | 7/2012 | Miya | H03H 11/20 |
| | | | | 333/139 |
| 2007/0188264 | A1 | 8/2007 | Miyaguchi et al. | |
| 2012/0049985 | A1 | 3/2012 | Kawai et al. | |

FOREIGN PATENT DOCUMENTS

| | | |
|---|---|---|
| JP | 2014-003460 A | 1/2014 |
| WO | WO 2005/093951 A1 | 10/2005 |

OTHER PUBLICATIONS

Japanese Office Action for Japanese Application No. 2016-529479, dated Sep. 6, 2016, including an English translation.
Kaper et al., "Monolithic AlGaN/GaN HEMT SPDT switch", IEEE, 12th GAAS® Symposium, Amsterdam, 2004, pp. 83-86.

* cited by examiner

HIGH FREQUENCY SWITCH

TECHNICAL FIELD

The present invention relates to a high frequency switch for switching a passing path of a transmission signal or a reception signal, which is a high frequency signal.

BACKGROUND ART

Non-Patent Literature 1 below discloses a high frequency switch for switching a passing path of a transmission signal or a reception signal, which is a high frequency signal.

This high frequency switch is structured by the following four transistors Q1 to Q4:

(1) a transistor Q1 having one end connected to a common terminal COM and another end connected to an input terminal IN1;

(2) a transistor Q2 having one end connected to the common terminal COM and another end connected to an input terminal IN2;

(3) a transistor Q3 having one end connected to the input terminal IN1 and another end that is grounded; and (4) a transistor Q4 having one end connected to the input terminal IN2 and another end that is grounded.

In this high frequency switch, when a passing state is set between the input terminal IN1 and the common terminal COM while a shutoff state is set between the input terminal IN2 and the common terminal COM, the transistors Q1 and Q4 are controlled to be in an on state and the transistors Q2 and Q3 are controlled to be in an off state.

On the other hand, when a shutoff state is set between the input terminal IN1 and the common terminal COM while a passing state is set between the input terminal IN2 and the common terminal COM, the transistors Q1 and Q4 are controlled to be in an off state and the transistors Q2 and Q3 are controlled to be an on state.

By controlling the states of the transistors Q1 to Q4 in this manner, it is possible to change the passing path of the high frequency signal.

In this high frequency switch, by widening gate widths of the transistors Q1 and Q2, saturation power of those transistors Q1 and Q2 increases, and thus power handling capability of the switch can be enhanced.

CITATION LIST

Non-Patent Literature 1: "Monolithic AlGaN/GaN HEMT SPDT switch," IEEE 12th GaAs Symposium, pp. 83-86, 2004.

SUMMARY OF INVENTION

Since the conventional high frequency switch is structured as described above, by widening the gate widths of the transistors Q1 and Q2, the power handling capability can be enhanced. However, there is a problem that it may be hard to obtain low loss characteristics when high capability of power handling is realized.

Specifically, a transistor being wide in gate width typically has poor shutoff properties. Thus, if the gate width of the transistor Q1 is widened, a phenomenon may occur such that, when the shutoff state is set between the input terminal IN1 and the common terminal COM while the passing state is set between the input terminal IN2 and the common terminal COM, a high frequency signal being input through the input terminal IN2 leaks out toward the input terminal IN1 side. As a result, there may be a problem that a passing loss between the input terminal IN2 and the common terminal COM increases. On the other hand, if the gate width of the transistor Q2 is widened, a phenomenon may occur such that, when the passing state is set between the input terminal IN1 and the common terminal COM while the shutoff state is set between the input terminal IN2 and the common terminal COM, a high frequency signal input through the input terminal IN1 leaks out toward the input terminal IN2 occurs side. As a result, there may be a problem that a passing loss between the input terminal IN1 and the common terminal COM increases.

The present invention has been made to solve such problems. An objective of the present invention is to provide a high frequency switch that is able to suppress increase in the loss even when power handling capability is enhanced.

A high frequency switch according to the present invention includes: a first capacitor connected between a first input/output terminal and a second input/output terminal; a second capacitor connected between the first input/output terminal and a third input/output terminal; a first line having an inductance component and having one end that is connected to the first input/output terminal; a second line having an inductance component and having one end that is connected to the second input/output terminal and having another end that is connected to another end of the first line; a third line having an inductance component and having one end that is connected to the first input/output terminal; a fourth line having an inductance component and having one end that is connected to the third input/output terminal and having another end that is connected to another end of the third line; a first transistor having one end that is connected to said another ends of the first and second lines and having another end that is grounded; and a second transistor having one end that is connected to said another ends of the third and fourth lines and having another end that is grounded.

According to the present invention, increase in the loss can be suppressed even when power handling capability is enhanced.

DESCRIPTION OF EMBODIMENTS

Hereinafter, to describe the present invention in more detail, embodiments for implementing the present invention will be described with referring to the accompanying drawings.

Embodiment 1

Figure 1:
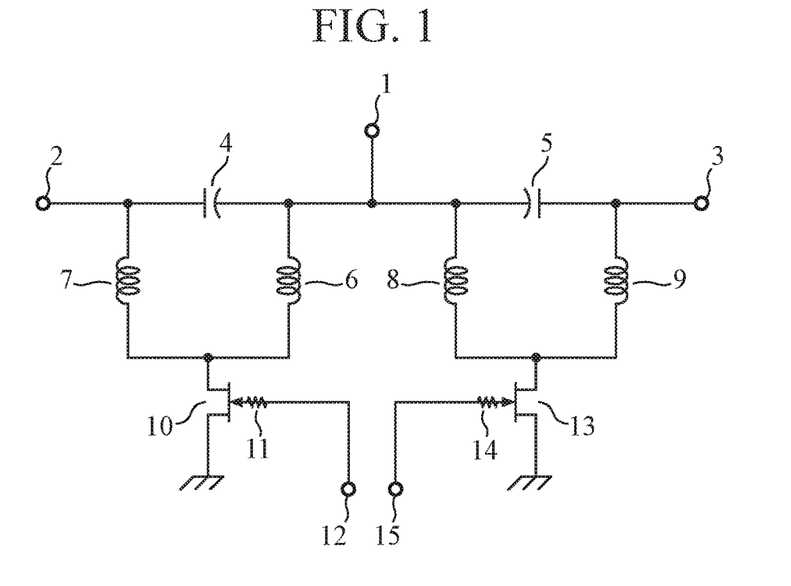
FIG. 1 is a structural diagram illustrating a high frequency switch according to an Embodiment 1 of the present invention.

FIG. 1 is a structural diagram illustrating a high frequency switch according to an Embodiment 1 of the present invention.

Figure 2:
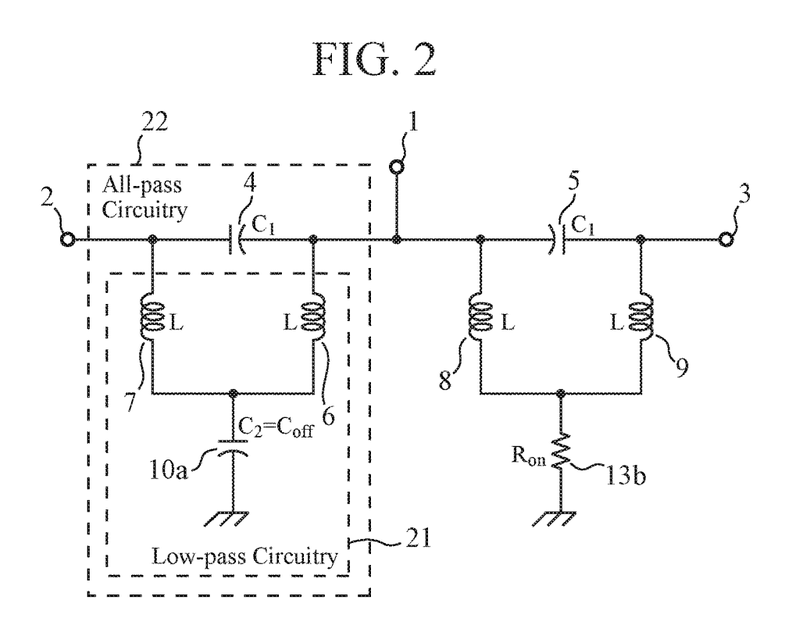
FIG. 2 is equivalent circuits of the high frequency switch in a case where a passing state is set between an input/output terminal 1 and an input/output terminal 2 while a shutoff state is set between the input/output terminal 1 and an input/output terminal 3.

FIG. 2 is equivalent circuits of the high frequency switch in a case where a passing state is set between an input/output terminal 1 and an input/output terminal 2 while a shutoff state is set between the input/output terminal 1 and an input/output terminal 3

Figure 3:
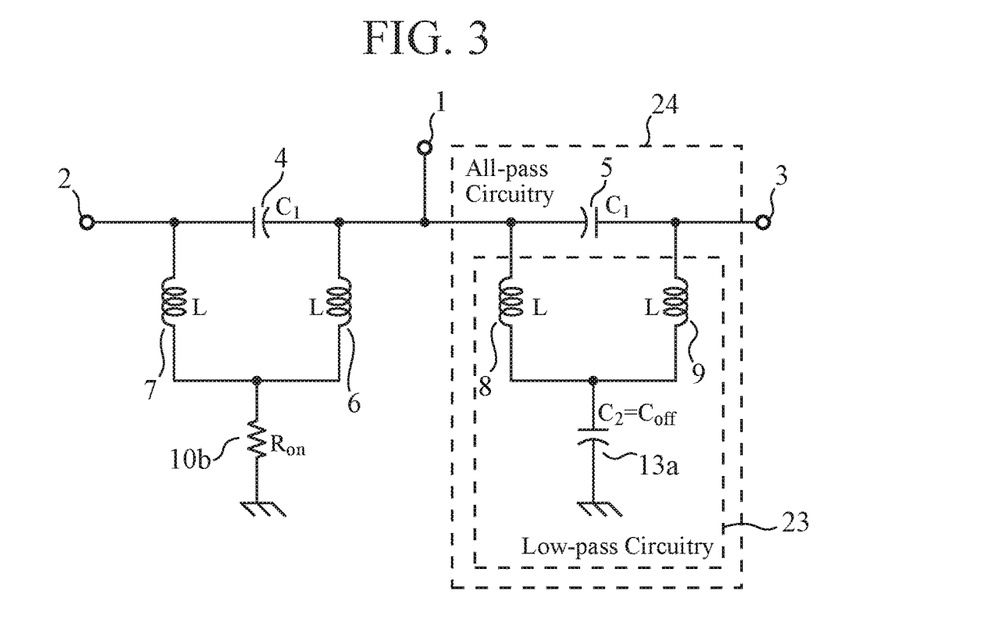
FIG. 3 is equivalent circuits of the high frequency switch in a case where a shutoff state is set between the input/output terminal 1 and the input/output terminal 2 while a passing state is set the input/output terminal 1 and the input/output terminal 3.

FIG. 3 is equivalent circuits of the high frequency switch in a case where a shutoff state is set between the input/output terminal 1 and the input/output terminal 2 while a passing state is set between the input/output terminal 1 and the input/output terminal 3.

In FIGS. 1 to 3, the input/output terminal 1 is a first input/output terminal for inputting/outputting a high frequency signal (a transmission signal or a reception signal).

The input/output terminal 2 is a second input/output terminal for inputting/outputting a high frequency signal.

The input/output terminal 3 is a third input/output terminal for inputting/outputting a high frequency signal.

A capacitor 4 is a first capacitor connected between the input/output terminal 1 and the input/output terminal 2.

A capacitor 5 is a second capacitor connected between the input/output terminal 1 and the input/output terminal 3.

An inductor 6 is a first line having an inductance component. One end of the inductor 6 is connected to the input/output terminal 1.

An inductor 7 is a second line having an inductance component. One end of the inductor 7 is connected to the input/output terminal 2, and another end of the inductor 7 is connected to another end of the inductor 6.

An inductor 8 is a third line having an inductance component. One end of the inductor 8 is connected to the input/output terminal 1.

An inductor 9 is a fourth line having an inductance component. One end of the inductor 9 is connected to the input/output terminal 3, and another end of the inductor 9 is connected to another end of the inductor 8.

A transistor 10 is a first transistor. The transistor 10 has a drain terminal (one end of the transistor 10) that is connected to another ends of the inductors 6 and 7, a source terminal (another end of the transistor 10) that is grounded, and a gate terminal that is connected to a control terminal 12 through a resistor 11.

The control terminal 12 is a terminal, to which a signal is input to supply a voltage equal to or higher than a pinch-off voltage to the gate terminal of the transistor 10 when setting an on state between drain-source of the transistor 10, and to which a signal is input to supply a voltage less than the pinch-off voltage to the gate terminal of the transistor 10 when setting an off state between the drain-source of the transistor 10.

During the on state between the drain-source of the transistor 10, the transistor 10 can be regarded as a resistor. Hereinafter, this resistor is referred to as "on-resistor". In FIG. 3, the on-resistor is denoted with a reference sign 10b.

During the off state between the drain-source of the transistor 10, the transistor 10 can be regarded as a capacitor. Hereinafter, this capacitor is referred to as "off-capacitor". In FIG. 2, the off-capacitor is denoted with a reference sign 10a.

A transistor 13 is a second transistor. The transistor 13 has a drain terminal (one end of the transistor 13) that is connected to another ends of the inductors 8 and 9, a source terminal (another end of the transistor 13) that is grounded, and a gate terminal that is connected to a control terminal 15 through a resistor 14.

The control terminal 15 is a terminal, to which a signal is input to supply a voltage equal to or higher than a pinch-off voltage to the gate terminal of the transistor 13 when setting the on state between drain-source of the transistor 13, and to which a signal is input to supply a voltage less than the pinch-off voltage to the gate terminal of the transistor 13 when setting the off state between the drain-source of the transistor 13.

During the on state between the drain-source of the transistor 13, the transistor 13 can be regarded as a resistor. Hereinafter, this resistor is referred to as "on-resistor". In FIG. 2, the on-resistor is denoted with a reference sign 13b.

During the off state between the drain-source of the transistor 13, the transistor 13 can be regarded as a capacitor. Hereinafter, this capacitor is referred to as "off-capacitor". In FIG. 3, the off-capacitor is denoted with a reference sign 13a.

FIG. 1 illustrates the example in which the drain terminal of the transistor 10 is connected to another ends of the inductors 6 and 7 while the source terminal is grounded. Alternatively, the source terminal of the transistor 10 may be connected to another ends of the inductors 6 and 7 while the drain terminal may be grounded.

Similarly, although FIG. 1 illustrates the example in which the drain terminal of the transistor 13 is connected to another ends of the inductors 8 and 9 while the source terminal is grounded, the source terminal of the transistor 13 may be connected to another ends of the inductors 8 and 9 while the drain terminal may be grounded.

In addition, each of the transistors 10 and 13 may be a transistor having three terminals consisting of a base terminal, a collector terminal, and an emitter terminal, instead of the gate terminal, the drain terminal, and the source terminal.

In the Embodiment 1, as illustrated in FIGS. 2 and 3, a capacitance value of each of the capacitors 4 and 5 is denoted as $C_1$, and an inductance of each of the inductors 6 to 9 is denoted as L.

Further, in the Embodiment 1, as illustrated in FIGS. 2 and 3, a capacitance value $C_{off}$ of each of the off-capacitors 10a and 13a in the transistors 10 and 13 is denoted as $C_2$, and the on-resistors 10b and 13b of the transistors 10 and 13 are denoted as $R_{on}$.

Next, an operation will be described.

With referring to FIG. 2, an operation will be described, in a case where the passing state is set between the input/output terminal 1 and the input/output terminal 2 while the shutoff state is set between the input/output terminal 1 and the input/output terminal 3.

In the Embodiment 1, the capacitance value of the capacitor 5 is set to $C_1$. The capacitor 5, which has the capacitance value $C_1$ being sufficiently low, is used so that a high frequency signal having a frequency f does not flow in the capacitor 5 even when the high frequency signal is input from the input/output terminal 1 or from the input/output terminal 2.

The impedance of the capacitor 5 is represented by $1/2\pi fC_1$. When the capacitance value $C_1$ is sufficiently low, the impedance of the capacitor 5 becomes sufficiently high.

Specifically, when the impedance of the capacitor 5 is sufficiently higher than the impedance obtained by looking into the input/output terminal 2 from the input/output terminal 1, most of the high frequency signal input through the input/output terminal 1 flows into the input/output terminal 2 side and does not flow to the capacitor 5.

Therefore, since the capacitance value $C_1$ of the capacitor 5 affects shutoff characteristics, it is desirably set as low as possible to enhance the shutoff characteristics. Note that, in a case, as illustrated in FIG. 3, where the capacitor 5 forms part of all-pass circuitry 24 during the passing state between the input/output terminal 1 and the input/output terminal 3, the capacitance value $C_1$ of the capacitor 5 needs to be determined to satisfy a matching condition described later in association with $C_2$ being the capacitance value $C_{off}$ of the off-capacitor 13a in the transistor 13.

The capacitance value of the capacitor 4 connected between the input/output terminal 1 and the input/output terminal 2 is set to $C_1$, similarly to the capacitor 5. Therefore, when a high frequency signal is input from the input/output terminal 1 or from the input/output terminal 2, the capacitor 4 prevents passage of the high frequency signal.

However, as illustrated in FIG. 2, since the drain-source of the transistor 10 is in the off state and the transistor 10 can be regarded as the off-capacitor 10a, low-pass circuitry 21 is formed by the inductors 6 and 7 and the off-capacitor 10a of the transistor 10.

Therefore, when the frequency f of a high frequency signal is included in the range of a pass band of the low-pass circuitry 21, the high frequency signal can pass through the low-pass circuitry 21. As a result, the passing state is set between the input/output terminal 1 and the input/output terminal 2.

In the Embodiment 1, the inductances L of the inductors 6 and 7 and the capacitance value $C_2$ of the off-capacitor 10a for the low-pass circuitry 21 are determined depending on the frequency f of a high frequency signal input from the input/output terminal 1 or from the input/output terminal 2 so that the high frequency signal can pass through the low-pass circuitry 21.

On the other hand, the capacitor 5 connected between the input/output terminal 1 and the input/output terminal 3 blocks passage of the high frequency signal input from the input/output terminal 1 or from the input/output terminal 2.

At this time, the drain-source of the transistor 13 is in the on state, and the transistor 13 serves as the on-resistor 13b, as illustrated in FIG. 2. Since the transistor 13 does not serve as the off-capacitor 13a, low-pass circuitry is not formed between the input/output terminal 1 and the input/output terminal 3. That is, in reality, not only the resistance value $R_{on}$ of the on-resistor 13b but also the capacitance value $C_{off}$ exists in parallel. However, when considering contrast between magnitudes of the impedances, the on-resistor 13b alone can be regarded as existing. Therefore, low-pass circuitry is not formed between the input/output terminal 1 and the input/output terminal 3.

Consequently, even when the impedance of circuitry including the inductors 8 and 9 and the on-resistor 13b of the transistor 13 becomes sufficiently higher than the impedance of the low-pass circuitry 21 and a high frequency signal is input from, for example, the input/output terminal 1, most of the high frequency signal flows into the input/output terminal 2 side. As a result, the shutoff state is set between the input/output terminal 1 and the input/output terminal 3.

Note that, in the Embodiment 1, it is assumed to use the transistor 13 serving as the on-resistor 13b whose resistance value $R_{on}$ is sufficiently low. According to this assumption, when a high frequency signal is input from, for example, the input/output terminal 1, the high frequency signal is short-circuited to the ground. As a result, the high frequency signal does not flow into the input/output terminal 3 side, and thus shutoff characteristics between the input/output terminal 1 and the input/output terminal 3 is further enhanced. Even in a case where the high frequency signal input from the input/output terminal 1 is not short-circuited to the ground because the transistor 13, which serves as the on-resistor 13b whose resistance value $R_{on}$ is sufficiently low, is not used, low-pass circuitry is not formed between the input/output terminal 1 and the input/output terminal 3, as described above. Therefore, even in such a case, the shutoff state is kept between the input/output terminal 1 and the input/output terminal 3.

The example has been described, in which the low-pass circuitry 21 is formed of the inductors 6 and 7 and the off-capacitor 10a of the transistor 10. Alternatively, when the capacitance value $C_1$ of the capacitor 4, the inductances L of the inductors 6 and 7, and the capacitance value $C_2$ of the off-capacitor 10a are set to satisfy matching conditions specified by the following equations (1) and (2), all-pass circuitry 22, in which gains of all of frequencies are flat, is formed of the capacitor 4, the inductors 6 and 7, and the off-capacitor 10a of the transistor 10. Once the all-pass circuitry 22 is formed, the passing state is set between the input/output terminal 1 and the input/output terminal 2 irrespective of the frequency f of the high frequency signal.
(Matching Condition)

$$C_2 = 4C_1 \tag{1}$$

$$Z_0 = \sqrt{\frac{L}{2C_1}} \tag{2}$$

Note that $Z_0$ is the impedance of a system (the impedance of an external circuit connected to the input/output terminals 1, 2, and 3).

Next, an operation will be described, in a case where the shutoff state is set between the input/output terminal 1 and the input/output terminal 2 while the passing state is set between the input/output terminal 1 and the input/output terminal 3, as illustrated in FIG. 3.

When a high frequency signal is input from the input/output terminal 1 or from the input/output terminal 3, the capacitor 5 connected between the input/output terminal 1 and the input/output terminal 3 blocks the passage of the high frequency signal.

However, as illustrated in FIG. 3, since the drain-source of the transistor 13 is in the off state and the transistor 13 serves as the off-capacitor 13a, low-pass circuitry 23 is formed by the inductors 8 and 9 and the off-capacitor 13a of the transistor 13.

Therefore, when the frequency f of the high frequency signal is included in the range of a pass band of the low-pass circuitry 23, the high frequency signal can pass through the low-pass circuitry 23. As a result, the passing state is set between the input/output terminal 1 and the input/output terminal 3.

In the Embodiment 1, the inductances L of the inductors 8 and 9 and the capacitance value $C_2$ of the off-capacitor 13a for the low-pass circuitry 23 are determined depending on the frequency f of a high frequency signal input from the input/output terminal 1 or from the input/output terminal 3 so that the high frequency signal can pass through the low-pass circuitry 23.

On the other hand, the capacitor 4 connected between the input/output terminal 1 and the input/output terminal 2 blocks passage of the high frequency signal input from the input/output terminal 1 or from the input/output terminal 3.

At this time, the drain-source of the transistor 10 is in the on state, and the transistor 10 serves as the on-resistor 10b as illustrated in FIG. 3. Since the transistor 10 does not serve as the off-capacitor 10a, low-pass circuitry is not formed between the input/output terminal 1 and the input/output terminal 2. That is, in reality, not only the resistance value $R_{on}$ of the on-resistor 10b but also the capacitance value $C_{off}$ exists in parallel. However, when considering the magnitude of the impedance, only the on-resistor 10b can be regarded as existing, and thus low-pass circuitry is not formed between the input/output terminal 1 and the input/output terminal 2.

Consequently, the impedance of circuitry including the inductors 6 and 7 and the on-resistor 10b of the transistor 10 becomes sufficiently higher than the impedance of the low-pass circuitry 23. For example, even when a high frequency signal is input from the input/output terminal 1, most of the high frequency signal flows into the input/output terminal 3 side. As a result, the shutoff state is set between the input/output terminal 1 and the input/output terminal 2.

Note that, in the Embodiment 1, it is assumed to use the transistor 10 serving as the on-resistor 10b whose resistance value $R_{on}$ is sufficiently low. According to this assumption, when a high frequency signal is input from, for example, the input/output terminal 1, the high frequency signal is short-circuited to the ground. As a result, the high frequency signal does not flow into the input/output terminal 2 side, and thus shutoff characteristics between the input/output terminal 1 and the input/output terminal 2 is further enhanced. Even in a case where the high frequency signal input from the input/output terminal 1 is not short-circuited to the ground because the transistor 10, which serves as the on-resistor 10b whose resistance value $R_{on}$ is sufficiently low, is not used, low-pass circuitry is not formed between the input/output terminal 1 and the input/output terminal 2, as described above. Therefore, even in such a case, the shutoff state is kept between the input/output terminal 1 and the input/output terminal 2.

The example has been described, in which the low-pass circuitry 23 is formed of the inductors 8 and 9 and the off-capacitor 13a of the transistor 13. Alternatively, when the inductances L of the inductors 8 and 9, and the capacitance value $C_2$ of the off-capacitor 13a are set to satisfy matching conditions specified by the foregoing equations (1) and (2), all-pass circuitry 24, in which gains of all of frequencies are flat, is formed of the capacitor 5, the inductors 8 and 9, and the off-capacitor 13a of the transistor 13. Once the all-pass circuitry 24 is formed, the passing state is set between the input/output terminal 1 and the input/output terminal 3 irrespective of the frequency f of the high frequency signal.

Next, a relation between the high capability of power handling and the shutoff characteristics of the high frequency switch will be described.

Assuming that the power of the high frequency signal input from the input/output terminal 1 is denoted as $P_{in}$, an RF current $I_{RF}$, which is specified by the following equation (3), flows in the on-resistor 10b (or 13b) of the transistor 10 (or 13) during the on state.

$$I_{RF} = \sqrt{\frac{2P_{in}}{Z_0}} \tag{3}$$

Further, a maximum power handling capability $P_{max}$ of the transistor 10 (or 13) during the on state is expressed with a saturation current $I_{dss}$ at the gate voltage of 0 V and the impedance $Z_0$ of the system, as specified by the following equation (4).

$$P_{max} = \frac{Z_0 I_{dss}^2}{2} \tag{4}$$

Moreover, the saturation current $I_{dss}$ of the transistor 10 (or 13) is expressed with a gate width Wg and a saturation current $I_{dss0}$ per a unit width of the gate of the transistor 10 (or 13), as specified by the following equation (5).

$$I_{dss} = I_{dss0} \times Wg \tag{5}$$

The gate width Wg is an element parameter of the transistor 10 (or 13) and is given at the design stage. In order to enhance the power handling capability of the transistor 10 (or 13) during the on state, the gate width Wg needs to be widened.

However, by widening the gate width Wg is widened, the resistance value $R_{on}$ of the on-resistor decreases, as specified by the following equation (6), whereas the capacitance value $C_{off}$ of the off-capacitor increases, as specified by the following equation (7).

$$R_{on} = \frac{R_{on0}}{Wg} \tag{6}$$

$$C_{off} = C_{off0} \times Wg \tag{7}$$

$R_{on0}$ is the resistance value of the on-resistor per a unit of gate width, and $C_{off0}$ is the capacitance value of the off-capacitor per unit gate width.

In this way, when the gate width Wg is widened in order to enhance the power handling capability of the transistor 10 (or 13) during the on state, the capacitance value $C_{off}$ of the off-capacitor is increased.

Given that the inductances L of the inductors 6 and 7 (or 8 and 9) and the capacitance value $C_2$ of the off-capacitor 10a (or 13a) are set to satisfy the matching conditions specified by the foregoing equations (1) and (2), the capacitance value $C_1$ of the capacitor 4 (or 5) is increased as the capacitance value $C_2$ (=$C_{off}$) of the off-capacitor 10a (or 13a) increases. This is because the capacitance value $C_1$ of the capacitor 4 (or 5) and the capacitance value $C_2$ (=$C_{off}$) of the off-capacitor 10a (or 13a) are proportional to each other, as specified in the equation (1).

Therefore, when the gate width Wg is widened, the capacitance value $C_1$ of the capacitor 4 (or 5), which enhances the shutoff characteristics, is increased.

When a transistor is connected between two input/output terminals, like in the high frequency switch described in Non-Patent Literature 1, a capacitance value $C_{off}$ of an off-capacitor of the transistor directly affects shutoff characteristics. In this case, if widening a gate width Wg of the transistor, the capacitance value $C_{off}$ of the off-capacitor is increased and thus the shutoff characteristics are deteriorated.

In contrast, in the Embodiment 1, no transistor is connected between the input/output terminal 1 and the input/output terminal 2 (or 3), and the capacitance value $C_1$ of the capacitor 4 (or 5) connected between the input/output terminal 1 and the input/output terminal 2 (or 3) is one-quarter of the capacitance value $C_2$ of the off-capacitor 10a (or 13a). Therefore, even when the gate width Wg is widened, an increase in the capacitance value $C_1$ affecting the shutoff characteristics is one-quarter of that of the transistor connected between two input/output terminals, like in Non-Patent Literature 1.

As is clear from the above description, according to the Embodiment 1, there are provided the capacitor 4 connected between the input/output terminal 1 and the input/output terminal 2, the capacitor 5 connected between the input/output terminal 1 and the input/output terminal 3, the inductor 6 having one end connected to the input/output terminal 1, the inductor 7 having one end connected to the input/output terminal 2 and another end connected to another end of the inductor 6, the inductor 8 having one end connected to the input/output terminal 1, the inductor 9 having one end connected to the input/output terminal 3 and another end connected to another end of the inductor 8, the transistor 10 having the drain terminal connected to another ends of the inductors 6 and 7 and the source terminal grounded, and the transistor 13 having the drain terminal connected to another ends of the inductors 8 and 9 and the source terminal grounded. Therefore, even when the power handling capability is enhanced, it is possible to achieve the effect of suppressing an increase in loss caused by deterioration of the shutoff characteristics.

Embodiment 2

In the Embodiment 1, the example has been described, in which the first to fourth lines, each having an inductance component, are the inductors 6 to 9. Alternatively, the first to fourth lines may be distribution constant lines.

Figure 4:
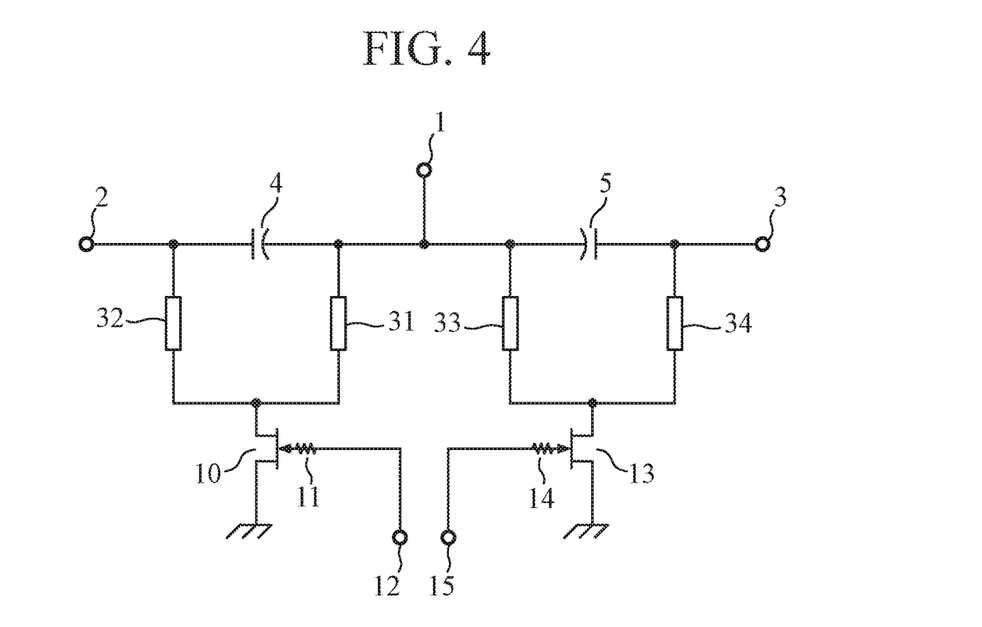
FIG. 4 is a structural diagram illustrating a high frequency switch according to an Embodiment 2 of the present invention.

FIG. 4 is a structural diagram illustrating a high frequency switch according to an Embodiment 2 of the present invention. In FIG. 4, the same reference sign as that in FIG. 1 denotes the same or corresponding part, and thus the description thereof will be omitted.

Figure 5:
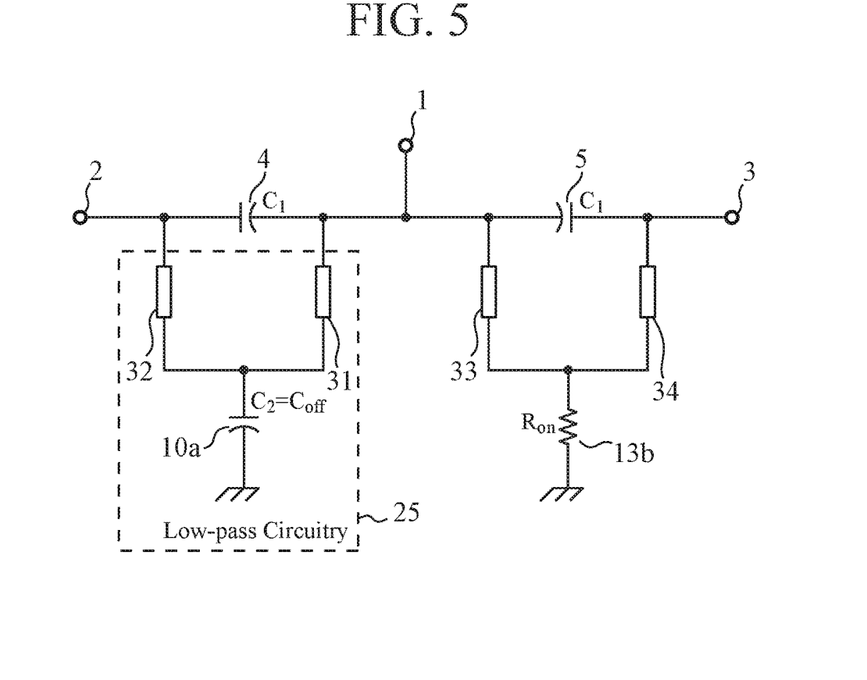
FIG. 5 is equivalent circuits of the high frequency switch in a case where a passing state is set between the input/output terminal 1 and the input/output terminal 2 while a shutoff state is set between the input/output terminal 1 and the input/output terminal 3.

FIG. 5 is equivalent circuits of the high frequency switch in a case where a passing state is set between the input/output terminal 1 and the input/output terminal 2 while a shutoff state is set between the input/output terminal 1 and the input/output terminal 3.

Figure 6:
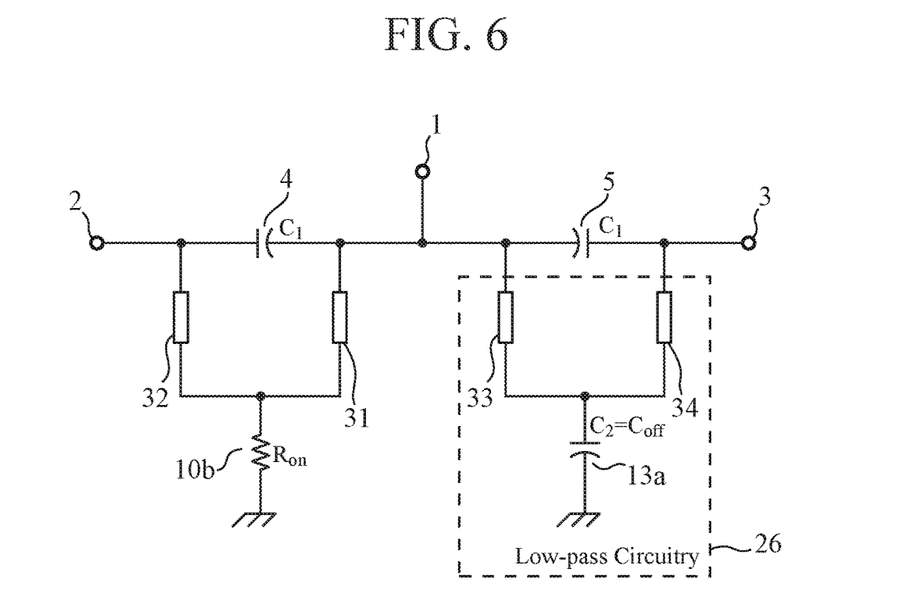
FIG. 6 is equivalent circuits of the high frequency switch in a case where a shutoff state is set between the input/output terminal 1 and the input/output terminal 2 while a passing state is set between the input/output terminal 1 and the input/output terminal 3.

FIG. 6 is equivalent circuits of the high frequency switch in a case where a shutoff state is set between the input/output terminal 1 and the input/output terminal 2 while a passing state is set between the input/output terminal 1 and the input/output terminal 3.

A distribution constant line 31 is a first line having an inductance component. One end of the distribution constant line 31 is connected to the input/output terminal 1.

A distribution constant line 32 is a second line having an inductance component. One end of the distribution constant line 32 is connected to the input/output terminal 2, and another end of the distribution constant line 32 is connected to another end of the distribution constant line 31.

A distribution constant line 33 is a third line having an inductance component. One end of the distribution constant line 33 is connected to the input/output terminal 1.

A distribution constant line 34 is a fourth line having an inductance component. One end of the distribution constant line 34 is connected to the input/output terminal 3 and another end is connected to another end of the distribution constant line 33.

In the Embodiment 2, it is assumed that an electrical length of each of the distribution constant lines 33 and 34 is set to one-quarter of a wavelength of a high frequency signal input from the input/output terminal 1 or from the input/output terminal 2.

On the assumption that each electrical length of the distribution constant lines 33 and 34 is set to one-quarter of the wavelength of the high frequency signal, when the shutoff state is set between the input/output terminal 1 and the input/output terminal 3 as illustrated in FIG. 5, an impedance obtained by looking into the input/output terminal 3 from the input/output terminal 1 can be substantially regarded as open.

Further, it is assumed that an electrical length of each of the distribution constant lines 31 and 32 is set to one-quarter of a wavelength of a high frequency signal input from the input/output terminal 1 or from the input/output terminal 2.

On the assumption that each electrical length of the distribution constant lines 31 and 32 is set to one-quarter of the wavelength of the high frequency signal, when the shutoff state is set between the input/output terminal 1 and the input/output terminal 2 as illustrated in FIG. 6, an impedance obtained by looking into the input/output terminal 2 from the input/output terminal 1 can be substantially regarded as open.

Next, an operation will be described.

With referring to FIG. 5, an operation will be described, in a case where the passing state is set between the input/output terminal 1 and the input/output terminal 2 while the shutoff state is set between the input/output terminal 1 and the input/output terminal 3.

When a high frequency signal is input from the input/output terminal 1 or from the input/output terminal 2, a capacitor 4 blocks passage of the high frequency signal.

However, as illustrated in FIG. 5, since the drain-source of a transistor 10 is in an off state and the transistor 10 can be regarded as an off-capacitor 10a, low-pass circuitry 25 is formed by inductance components of the distribution constant lines 31 and 32, and the off-capacitor 10a of the transistor 10.

Therefore, when a frequency f of the high frequency signal is included in the range of a pass band of the low-pass circuitry 25, the high frequency signal can pass through the low-pass circuitry 25. As a result, the passing state is set between the input/output terminal 1 and the input/output terminal 2.

In the Embodiment 2, the inductance components of the distribution constant lines 31 and 32 and a capacitance value $C_2$ of the off-capacitor 10a for the low-pass circuitry 25 are determined depending on the frequency f of the high frequency signal input from the input/output terminal 1 or from the input/output terminal 2 so that the high frequency signal can pass through the low-pass circuitry 25.

On the other hand, the capacitor 5 connected between the input/output terminal 1 and the input/output terminal 3 blocks passage of the high frequency signal input from the input/output terminal 1 or from the input/output terminal 2.

At this time, the drain-source of the transistor 13 is in an on state, and the transistor 13 serves as an on-resistor 13b, as illustrated in FIG. 5. Since the transistor 13 does not serve as an off-capacitor 13a, low-pass circuitry is not formed between the input/output terminal 1 and the input/output terminal 3.

Consequently, even when the impedance of circuitry including the distribution constant lines 33 and 34 and the on-resistor 13b of the transistor 13 becomes sufficiently higher than the impedance of the low-pass circuitry 25 and a high frequency signal is input from, for example, the input/output terminal 1, most of the high frequency signal flows into the input/output terminal 2 side. As a result, the shutoff state is set between the input/output terminal 1 and the input/output terminal 3.

Note that, in the Embodiment 2, it is assumed that each electrical length of the distribution constant lines 33 and 34 are set to one-quarter of the wavelength of the high frequency signal. It is also assumed that the transistor 13, which serves as the on-resistor 13b whose resistance value $R_{on}$ is sufficiently low, is used. According to those assumptions, the position where the transistor 13 exists is short-circuited to the ground. Therefore, positions away from the position of the transistor 13 by the quarter wavelength, that is, positions where the distribution constant lines 33 and 34 have connections to the input/output terminals 1 and 3, can be regarded as open. As a result, shutoff characteristics between the input/output terminal 1 and the input/output terminal 3 are enhanced. Even if the positions where the distribution constant lines 33 and 34 have connections to the input/output terminals 1 and 3 cannot be regarded as open because each electrical length of the distribution constant lines 33 and 34 is not set to one-quarter of the wavelength of the high frequency signal, low-pass circuitry is not formed between the input/output terminal 1 and the input/output terminal 3, as described above. Therefore, even in such a case, the shutoff state is kept between the input/output terminal 1 and the input/output terminal 3.

With referring to FIG. 6, an operation will be described, in a case where the shutoff state is set between the input/output terminal 1 and the input/output terminal 2 while the passing state is set between the input/output terminal 1 and the input/output terminal 3.

When a high frequency signal is input from the input/output terminal 1 or from the input/output terminal 3, a capacitor 5 blocks passage of the high frequency signal.

However, as illustrated in FIG. 6, since the drain-source of a transistor 13 is in an off state and the transistor 13 can be regarded as an off-capacitor 13a, low-pass circuitry 26 is formed by inductance components of the distribution constant lines 33 and 34, and the off-capacitor 13a of the transistor 13.

Therefore, when a frequency f of the high frequency signal is included in the range of a pass band of the low-pass circuitry 26, the high frequency signal can pass through the low-pass circuitry 26. As a result, the passing state is set between the input/output terminal 1 and the input/output terminal 3.

In the Embodiment 2, the inductance components of the distribution constant lines 33 and 34 and a capacitance value $C_2$ of the off-capacitor 13a for the low-pass circuitry 26 are determined depending on the frequency f of the high frequency signal input from the input/output terminal 1 or from the input/output terminal 3 so that the high frequency signal can pass through the low-pass circuitry 26.

On the other hand, the capacitor 4 connected between the input/output terminal 1 and the input/output terminal 2 blocks passage of the high frequency signal input from the input/output terminal 1 or from the input/output terminal 3.

At this time, the drain-source of the transistor 10 is in an on state, and the transistor 10 serves as an on-resistor 10b, as illustrated in FIG. 6. Since the transistor 10 does not serve as an off-capacitor 10a, low-pass circuitry is not formed between the input/output terminal 1 and the input/output terminal 2.

Consequently, even when the impedance of circuitry including the distribution constant lines 31 and 32 and the on-resistor 10b of the transistor 10 becomes sufficiently higher than the impedance of the low-pass circuitry 26 and a high frequency signal is input from, for example, the input/output terminal 1, most of the high frequency signal flows into the input/output terminal 3 side. As a result, the shutoff state is set between the input/output terminal 1 and the input/output terminal 2.

Note that, in the Embodiment 2, it is assumed that each electrical length of the distribution constant lines 31 and 32 are set to one-quarter of the wavelength of the high frequency signal. It is also assumed that the transistor 10, which serves as the on-resistor 10b whose resistance value $R_{on}$ is sufficiently low, is used. According to those assumptions, the position where the transistor 10 exists is short-circuited to the ground. Therefore, positions away from the position of the transistor 10 by the quarter wavelength, that is, positions where the distribution constant lines 31 and 32 have connections to the input/output terminals 1 and 2, can be regarded as open. As a result, shutoff characteristics between the input/output terminal 1 and the input/output terminal 2 are enhanced. Even if the positions where the distribution constant lines 31 and 32 have connections to the input/output terminals 1 and 2 cannot be regarded as open because each electrical length of the distribution constant lines 31 and 32 is not set to one-quarter of the wavelength of the high frequency signal, low-pass circuitry is not formed between the input/output terminal 1 and the input/output terminal 2, as described above. Therefore, even in such a case, the shutoff state is kept between the input/output terminal 1 and the input/output terminal 2.

Next, a relation between the high capability of power handling and the shutoff characteristics of the high frequency switch will be described.

When the capacitance value of the capacitor 4 or 5 is $C_1$ and the capacitance value of the off-capacitor 10a or 13a of the transistor 10 or 13 is $C_2$, the capacitance value $C_1$ of the capacitor 4 or 5 and the capacitance value $C_2$ of the off-capacitor 10a or 13a are set as the following equation (8), similarly to the Embodiment 1.

$$C_2 = 4C_1 \quad (8)$$

Also in the Embodiment 2, similarly to the Embodiment 1, no transistor is connected between the input/output terminal 1 and the input/output terminal 2 (or 3), and the capacitance value $C_1$ of the capacitor 4 (or 5) connected between the input/output terminal 1 and the input/output terminal 2 (or 3) is one-quarter of the capacitance value $C_2$ of the off-capacitor 10a (or 13a), as specified by the equation (8). Therefore, even when a gate width Wg is widened, an increase in the capacitance value $C_1$ affecting the shutoff characteristics is one-quarter of the case described in Non-Patent Literature 1, where a transistor is connected between two input/output terminals.

As is clear from the above description, according to the Embodiment 2, provided are the capacitor 4 connected between the input/output terminal 1 and the input/output terminal 2, the capacitor 5 connected between the input/output terminal 1 and the input/output terminal 3, the distribution constant line 31 having one end connected to the input/output terminal 1, the distribution constant line 32 having one end connected to the input/output terminal 2 and another end connected to another end of the distribution constant line 31, the distribution constant line 33 having one end connected to the input/output terminal 1, the distribution constant line 34 having one end connected to the input/output terminal 3 and another end connected to another end of the distribution constant line 33, the transistor 10 having the drain terminal connected to another ends of the distribution constant lines 31 and 32 and the source terminal grounded, and the transistor 13 having the drain terminal connected to another ends of the distribution constant lines 33 and 34 and the source terminal grounded. Therefore, even when the power handling capability is enhanced, it is possible to achieve the effect of suppressing an increase in loss caused by deterioration of the shutoff characteristics.

Embodiment 3

In the above-described Embodiments 1 and 2, the high frequency switches has been described, in which circuitry of the input/output terminal 2 side and circuitry of the input/output terminal 3 side are symmetrical with respect to the input/output terminal 1. In an Embodiment 3, circuitry of the input/output terminal 2 side and circuitry of the input/output terminal 3 side are asymmetrical with respect to the input/output terminal 1.

Figure 7:
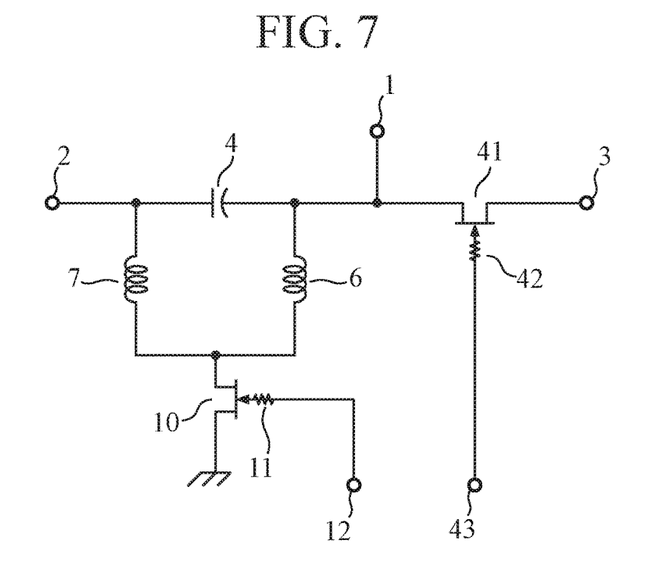
FIG. 7 is a structural diagram illustrating a high frequency switch according to an Embodiment 3 of the present invention.

FIG. 7 is a structural diagram illustrating a high frequency switch according to the Embodiment 3 of the present invention. In FIG. 7, the same reference sign as that in FIG. 1 denotes the same or corresponding part, and thus the description thereof will be omitted.

FIG. 7 illustrates an example in which a first line is an inductor 6 and a second line is inductor 7. Alternatively, the first line may be a distribution constant line 31 and the second line may be a distribution constant line 32, similarly to the Embodiment 2. Further, electrical lengths of the distribution constant lines 31 and 32 may be set to one-quarter of a wavelength of a high frequency signal, similarly to the Embodiment 2.

Figure 8:
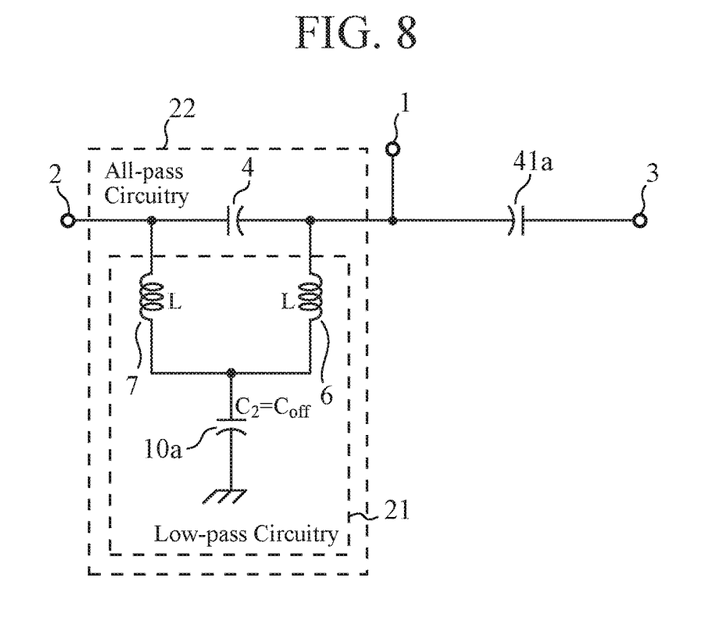
FIG. 8 is equivalent circuits of the high frequency switch in a case where a passing state is set between the input/output terminal 1 and the input/output terminal 2 while a shutoff state is set between the input/output terminal 1 and the input/output terminal 3.

FIG. 8 is equivalent circuits of the high frequency switch in a case where a passing state is set between the input/output terminal 1 and the input/output terminal 2 while a shutoff state is set between the input/output terminal 1 and the input/output terminal 3.

Figure 9:
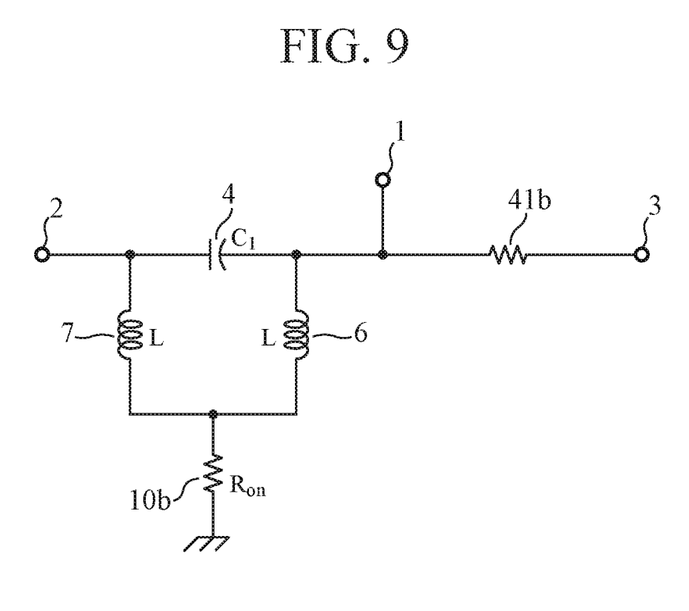
FIG. 9 is equivalent circuits of the high frequency switch in a case where a shutoff state is set between the input/output terminal 1 and the input/output terminal 2 while a passing state is set between the input/output terminal 1 and the input/output terminal 3.

FIG. 9 is equivalent circuits of the high frequency switch in a case where a shutoff state is set between the input/output terminal 1 and the input/output terminal 2 while a passing state is set between the input/output terminal 1 and the input/output terminal 3.

A transistor 41 is a switching member having a drain terminal (one end) connected to the input/output terminal 1, a source terminal (another end) connected to the input/output terminal 3, and a gate terminal connected to a control terminal 43 through a resistor 42.

The control terminal 43 is a terminal, to which a signal is input to apply a voltage equal to or higher than a pinch-off voltage to the gate terminal of the transistor 41 when setting an on state between the drain-source of the transistor 41, and to which a signal is input to apply a voltage less than the pinch-off voltage to the gate terminal of the transistor 41 when setting an off state between the drain-source of the transistor 41.

During the on state between the drain-source of the transistor 41, the transistor 41 can be regarded as a resistor. Hereinafter, this resistor is referred to as "on-resistor", and in FIG. 9, the on-resistor is denoted by a reference sign 41b.

During the off state between the drain-source of the transistor 41, the transistor 41 can be regarded as a capacitor. Hereinafter, this capacitor is referred to as "off-capacitor", and in FIG. 8, the off-capacitor is denoted by a reference sign 41a.

In FIG. 7, the drain terminal of the transistor 41 is connected to the input/output terminal 1, and the source terminal is connected to the input/output terminal 3. Alternatively, the source terminal of the transistor 41 may be connected to the input/output terminal 1, and the drain terminal may be connected to the input/output terminal 3.

Further, a transistor may be used as the transistor 41, whose three terminals are a base terminal, a collector terminal, and an emitter terminal, instead of the gate terminal, the drain terminal, and the source terminal.

In FIG. 7, the switching member connected between the input/output terminal 1 and the input/output terminal 3 is the transistor 41. However, the switching member is not limited to this case. For example, a switch may be used, which is closed when the input/output terminal 1 and the input/output terminal 3 are set to a passing state, and is opened when the input/output terminal 1 and the input/output terminal 3 are set to a shutoff state.

Next, an operation will be described.

With referring to FIG. 8, a case of an operation will be described, where the passing state is set between the input/output terminal 1 and the input/output terminal 2 while the shutoff state is set between the input/output terminal 1 and the input/output terminal 3.

When a high frequency signal is input from the input/output terminal 1 or from the input/output terminal 2, a capacitor 4 blocks passage of the high frequency signal.

However, since the drain-source of the transistor 10 is in the off state and the transistor 10 serves as the off-capacitor 10a, as illustrated in FIG. 8, low-pass circuitry 21 is formed by the inductors 6 and 7 and the off-capacitor 10a of the transistor 10.

Therefore, when the frequency f of the high frequency signal is included in the range of a pass band of the low-pass circuitry 21, the high frequency signal can pass through the low-pass circuitry 21. As a result, the passing state is set between the input/output terminal 1 and the input/output terminal 2.

In the Embodiment 3, inductances L of the inductors 6 and 7 and a capacitance value $C_2$ of an off-capacitor 10a for low-pass circuitry 21 are determined depending on the frequency f of a high frequency signal so that the high frequency signal input from the input/output terminal 1 or from the input/output terminal 2 can pass through the low-pass circuitry 21.

On the other hand, in the transistor 41 connected between the input/output terminal 1 and the input/output terminal 3, the off state is set between the drain-source, and the transistor 41 serves as an off-capacitor 41a.

At this time, when the impedance of the transistor 41 is sufficiently higher than the impedance obtained by looking into the input/output terminal 2 from the input/output terminal 1, most of the high frequency signal flows into the input/output terminal 2 side even when the high frequency signal is input from the input/output terminal 1. As a result, the shutoff state is set between the input/output terminal 1 and the input/output terminal 3.

Since the impedance of the transistor 41 becomes higher as the capacitance value of the off-capacitor 41a is lower, the capacitance value of the off-capacitor 41a influences the shutoff characteristics. In order to enhance the shutoff characteristics, the capacitance value of the off-capacitor 41a is desirably set to be as low as possible. Accordingly, in the Embodiment 3, it is assumed that the transistor 41 having a low capacitance value of the off-capacitor 41a is provided.

The example has been described, in which the low-pass circuitry 21 is formed of the inductors 6 and 7 and the off-capacitor 10a of the transistor 10. However, when the capacitance value $C_1$ of the capacitor 4, the inductances L of the inductors 6 and 7, and the capacitance value $C_2$ of the off-capacitor 10a are set to satisfy the matching conditions described in the foregoing equations (1) and (2), similarly to the Embodiment 1, all-pass circuitry 22 in which gains of all of frequencies are flat is formed by the capacitor 4, the inductors 6 and 7, and the off-capacitor 10a of the transistor 10. In the case where the all-pass circuitry 22 is formed, the passing state is set between the input/output terminal 1 and the input/output terminal 2 irrespective of the frequency f of the high frequency signal.

Next, with referring to FIG. 9, a case of an operation will be described, where the shutoff state is set between the input/output terminal 1 and the input/output terminal 2 while the passing state is set between the input/output terminal 1 and the input/output terminal 3.

In the transistor 41 connected between the input/output terminal 1 and the input/output terminal 3, the drain-source is in the on state, and the transistor 41 can be regarded as the on-resistor 41b. Therefore, the high frequency signal input from the input/output terminal 1 or from the input/output terminal 3 can pass through the transistor 41. As a result, the passing state is set between the input/output terminal 1 and the input/output terminal 3.

On the other hand, the capacitor 4 connected between the input/output terminal 1 and the input/output terminal 2 blocks passage of the high frequency signal input from the input/output terminal 1 or from the input/output terminal 3.

At this time, the drain-source of the transistor 10 is in the on state, and the transistor 10 serves as the on-resistor 10b, as illustrated in FIG. 9. Since the transistor 10 does not serves as the off-capacitor 10a, low-pass circuitry is not formed between the input/output terminal 1 and the input/output terminal 2.

Consequently, even when the impedance of circuitry including the inductors 6 and 7 and the on-resistor 10b of the transistor 10 becomes sufficiently higher than the impedance obtained by looking into the input/output terminal 3 from the input/output terminal 1 and a high frequency signal is input from, for example, the input/output terminal 1, most of the high frequency signal flows into the input/output terminal 3 side. As a result, the shutoff state is set between the input/output terminal 1 and the input/output terminal 2.

Note that, in the Embodiment 3, it is assumed to use the transistor 10 serving as the on-resistor 10b whose resistance value $R_{on}$ is sufficiently low. According to this assumption, when a high frequency signal is input from, for example, the input/output terminal 1, the high frequency signal is short-circuited to the ground. As a result, the high frequency signal does not flow into the input/output terminal 2 side, and thus shutoff characteristics between the input/output terminal 1 and the input/output terminal 2 is further enhanced. Even in a case where the high frequency signal input from the input/output terminal 1 is not short-circuited to the ground because the transistor 10, which serves as the on-resistor 10b whose resistance value $R_{on}$ is sufficiently low, is not used, low-pass circuitry is not formed between the input/output terminal 1 and the input/output terminal 2, as described above. Therefore, even in such a case, the shutoff state is kept between the input/output terminal 1 and the input/output terminal 2.

Next, a relation between the high capability of power handling and shutoff characteristics of the high frequency switch will be described.

In order to enhance power handling capability between the input/output terminal 1 and the input/output terminal 3, a gate width Wg of the transistor 41 needs to be widened. When the gate width Wg of the transistor 41 is widened, the capacitance value of the transistor 41 increases, and thus the shutoff characteristics between the input/output terminal 1 and the input/output terminal 3 are deteriorated.

On the other hand, when the gate width Wg of the transistor 10 is widened in order to enhance the power handling capability between the input/output terminal 1 and the input/output terminal 2, an increase in the capacitance value $C_1$ of the capacitor 4 affecting the shutoff characteristics is one-quarter of a case where a transistor is connected between the input/output terminal 1 and the input/output terminal 2, similarly to the Embodiment 1.

That is, when obtaining shutoff characteristics between the input/output terminal 1 and the input/output terminal 2 to be equivalent to those between the input/output terminal 1 and the input/output terminal 3, the capacitance value $C_1$ of the capacitor 4 can be one-quarter of the capacitance value of the transistor 41.

Therefore, even in a case where the high capability of power handling between the input/output terminal 1 and the input/output terminal 3 is not much required, whereas the high capability of power handling between the input/output terminal 1 and the input/output terminal 2 is required, it is capable of designing the gate width Wg of the transistor 41 to widen while designing the gate width Wg of the transistor 10 not to much widen.

With such design, downsizing of the high frequency switch can be achieved while obtaining desired the high capability of power handling characteristics and shutoff characteristics.

As is clear from the above description, according to the Embodiment 3, in a case where circuitry on the input/output terminal 2 side and circuitry on the input/output terminal 3 side are asymmetrical with respect to the input/output terminal 1, the high frequency switch exhibits an effect to suppress an increase in loss associated with deterioration of the shutoff characteristics even when enhancing the power handling capability, similarly to the Embodiments 1 and 2.

Note that the invention of the present application allows free combinations of the embodiments, modifications of arbitrary configuration elements of the embodiments, or omissions of arbitrary configuration elements in the embodiments, within the scope of the invention.

The high frequency switch according to the present invention is suitable for those required to enhance the power handling capability characteristics in the path on the passing side and the shutoff characteristics in the path on the shutoff side when changing a path of a transmission signal or a reception signal, each being a high frequency signal.

REFERENCE SIGNS LIST

1: Input/output terminal (First input/output terminal), 2: Input/output terminal (Second input/output terminal), 3: Input/output terminal (Third input/output terminal), 4: Capacitor (First capacitor), 5: Capacitor (Second capacitor), 6: Inductor (First line), 7: Inductor (Second line), 8: Inductor (Third line), 9: Inductor (fourth line), 10: Transistor (First transistor), 10$a$: Off-capacitor, 10$b$: On-resistor, 11: Resistor, 12: Control terminal, 13: Transistor (Second transistor), 13$a$: Off-capacitor, 13$b$: On-resistor, 14: Resistor, 15: Control terminal, 21, 23, 25, 26: Low-pass circuit, 22, 24: All-pass circuit, 31: Distribution constant line (First line), 32: Distribution constant line (Second line), 33: Distribution constant line (Third line), 34: Distribution constant line (Fourth line), 41: Transistor (Switching member), 41$a$: Off-capacitor, 41$b$: On-resistor, 42: Resistor, 43: Control terminal

The invention claimed is:

1. A high frequency switch comprising:
a first capacitor connected between a first input/output terminal and a second input/output terminal;
a second capacitor connected between the first input/output terminal and a third input/output terminal;
a first line having an inductance component and having one end that is connected to the first input/output terminal;
a second line having an inductance component and having one end that is connected to the second input/output terminal and having another end that is connected to another end of the first line;
a third line having an inductance component and having one end that is connected to the first input/output terminal;
a fourth line having an inductance component and having one end that is connected to the third input/output terminal and having another end that is connected to another end of the third line;
a first transistor having one end that is connected to said another ends of the first and second lines and having another end that is grounded; and
a second transistor having one end that is connected to said another ends of the third and fourth lines and having another end that is grounded.

2. The high frequency switch according to claim 1, wherein each of the first to fourth lines is an inductor.

3. The high frequency switch according to claim 2, wherein,
when an inductance of the inductor constituting each of the first to fourth lines is denoted by L, a capacitance value of each of the first and second capacitors is denoted by $C_1$, a capacitance value of an off-capacitor concerning the first transistor or the second transistor is denoted by $C_2$, the off-capacitor being obtained when the first transistor or the second transistor is in an off state, and an impedance of an external circuit connected to the first to third input/output terminals is denoted by $Z_0$,
the inductance L, the capacitance value $C_1$, and the capacitance value $C_2$ are set to satisfy equations $C_2=4C_1$ and $Z_0=(L/2C_1)^{1/2}$.

4. The high frequency switch according to claim 1, wherein each of the first to fourth lines is a distribution constant line.

5. The high frequency switch according to claim 4, wherein an electrical length of the distribution constant line constituting each of the first to fourth lines is set to one-quarter of a wavelength of a signal which is input from the first input/output terminal or the second input/output terminal or the third input/output terminal.

6. A high frequency switch comprising:
a capacitor connected between a first input/output terminal and a second input/output terminal;
a first line having an inductance component and having one end that is connected to the first input/output terminal;
a second line having an inductance component and having one end that is connected to the second input/output terminal and having another end that is connected to another end of the first line;
a transistor having one end that is connected to said another ends of the first and second lines and having another end that is grounded; and
a switching member having one end that is connected to the first input/output terminal and having another end that is connected to a third input/output terminal.

7. The high frequency switch according to claim 6, wherein each of the first and second lines is an inductor.

8. The high frequency switch according to claim 7, wherein,
when an inductance of the inductor constituting each of the first and second lines is denoted by L, a capacitance value of the capacitor is denoted by $C_1$, a capacitance value of an off-capacitor concerning the transistor is denoted by $C_2$, the off-capacitor being obtained when the transistor is in an off state, and an impedance of an external circuit connected to the first to third input/output terminals is denoted by $Z_0$,
the inductance L, the capacitance value $C_1$, and the capacitance value $C_2$ are set to satisfy equations $C_2=4C_1$ and $Z_0=(L/2C_1)^{1/2}$.

9. The high frequency switch according to claim 6, wherein each of the first and second lines is a distribution constant line.

10. The high frequency switch according to claim 9, wherein an electrical length of the distribution constant line constituting each of the first and second lines is set to one-quarter of a wavelength of a signal which is input from the second input/output terminal or the third input/output terminal.

* * * * *